United States Patent
Lin et al.

(10) Patent No.: US 9,680,527 B2
(45) Date of Patent: Jun. 13, 2017

(54) RADIATION HARDENED 10BASE-T ETHERNET PHYSICAL LAYER (PHY)

(71) Applicant: The United States of America as represented by the Administrator of the National Aeronautics and Space Administration, Washington, DC (US)

(72) Inventors: Michael R. Lin, Ellicott City, MD (US); David J. Petrick, Severna Park, MD (US); Kevin M. Ballou, Highland, MD (US); Daniel C. Espinosa, Tampa, FL (US); Edward F. James, Westminster, MD (US); Matthew A. Kliesner, Madison, AL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/855,992

(22) Filed: Sep. 16, 2015

(65) Prior Publication Data
US 2016/0248477 A1    Aug. 25, 2016

Related U.S. Application Data

(60) Provisional application No. 62/120,428, filed on Feb. 25, 2015.

(51) Int. Cl.
*H04B 3/00* (2006.01)
*H04L 25/00* (2006.01)
*H04B 3/54* (2006.01)
*H04B 3/60* (2006.01)
*H03K 19/177* (2006.01)

(52) U.S. Cl.
CPC ......... *H04B 3/54* (2013.01); *H03K 19/17744* (2013.01); *H04B 3/60* (2013.01)

(58) Field of Classification Search
CPC ... H04B 3/54; H04B 3/60; H04B 3/00; H04K 19/17744; H04L 25/0266; H01Q 1/525; H06F 11/106
USPC ........ 375/219, 220, 222, 257, 258; 343/837; 370/390; 307/128; 714/54
See application file for complete search history.

(56) References Cited

U.S. PATENT DOCUMENTS

| | | | |
|---|---|---|---|
| 7,200,176 B1* | 4/2007 | Paulos | H04L 25/0266 307/128 |
| 2011/0107158 A1* | 5/2011 | Espinosa | G06F 11/106 714/54 |
| 2014/0092903 A1* | 4/2014 | Maes | H04B 3/00 370/390 |
| 2014/0218255 A1* | 8/2014 | Sanford | H01Q 1/525 343/837 |

* cited by examiner

*Primary Examiner* — Phuong Phu (57) ABSTRACT

Embodiments may provide a radiation hardened 10BASE-T Ethernet interface circuit suitable for space flight and in compliance with the IEEE 802.3 standard for Ethernet. The various embodiments may provide a 10BASE-T Ethernet interface circuit, comprising a field programmable gate array (FPGA), a transmitter circuit connected to the FPGA, a receiver circuit connected to the FPGA, and a transformer connected to the transmitter circuit and the receiver circuit. In the various embodiments, the FPGA, transmitter circuit, receiver circuit, and transformer may be radiation hardened.

15 Claims, 10 Drawing Sheets

FIG. 11

RADIATION HARDENED 10BASE-T ETHERNET PHYSICAL LAYER (PHY)

CROSS-REFERENCE TO RELATED APPLICATIONS

This application claims priority to U.S. Provisional Patent Application No. 62/120,428 filed Feb. 25, 2015 entitled "Radiation Hardened 10BASE-T Ethernet PHY", the entire contents of which are hereby incorporated by reference.

STATEMENT REGARDING FEDERALLY SPONSORED RESEARCH OR DEVELOPMENT

The invention described herein was made in part by employees of the United States Government and may be manufactured and used by or for the Government of the United States of America for governmental purposes without the payment of any royalties thereon or therefore.

FIELD OF THE INVENTION

The present invention relates to Ethernet systems, and more particularly to radiation hardened Ethernet systems in compliance with the Institute of Electrical and Electronics Engineers (IEEE) 802.3 standard for Ethernet and suitable for space flight.

BACKGROUND

Communications systems used in spacecraft, such as space stations (e.g., the International Space Station (ISS), space vehicles, small satellites or nanosatellites (e.g., Cube-Sats), avionics (e.g., SpaceCube), etc., face challenges generally not encountered by earth based communication systems, such as radiation exposure and stringent piece part reliability requirements. Specifically, current 10BASE-T Ethernet interface circuits in compliance with the Institute of Electrical and Electronics Engineers (IEEE) 802.3 standard for Ethernet do not meet the radiation hardening requirements for space flight. The currently available commercial off the shelf (COTS) 10BASE-T Ethernet interface circuits are not acceptable for space flight because the COTS 10BASE-T Ethernet interface circuits are susceptible to radiation induced upsets and/or failure. Therefore, a radiation hardened 10BASE-T Ethernet interface circuit suitable for space flight and in compliance with the IEEE 802.3 standard for Ethernet is needed.

SUMMARY

The various embodiments may provide a radiation hardened 10BASE-T Ethernet interface circuit suitable for space flight and in compliance with the IEEE 802.3 standard for Ethernet. The various embodiments may provide a 10BASE-T Ethernet interface circuit, comprising a field programmable gate array (FPGA), a transmitter circuit connected to the FPGA, a receiver circuit connected to the FPGA, and a transformer connected to the transmitter circuit and the receiver circuit. In the various embodiments, the FPGA, transmitter circuit, receiver circuit, and transformer may be radiation hardened. In various embodiments, the FPGA may include a physical layer interface module configured to exchange data with a media access controller (MAC). In various embodiments, the transmitter circuit may be configured to receive a transmission signal, such as a transmission signal including a link pulse, from the physical layer interface module, and the transmitter circuit may comprise an amplification stage configured to amplify the transmission signal, and a filter stage connected to the amplification stage and configured to filter the amplified transmission signal. In various embodiments, the receiver circuit may be configured to send a difference indication signal to the physical layer interface module, and the receiver circuit may comprise a resistor network configured to reduce an amplitude of a received signal, and a low voltage differential signal receiver connected to the resistor network and configured to output the difference indication signal to the physical layer interface module in response to receiving the reduced amplitude received signal from the resistor network. In the various embodiments, the transformer may be configured to receive the filtered amplified transmission signal from the filter stage and output the filtered amplified transmission signal to a connector, and receive the received signal from the connector and output the received signal to the resistor network.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Currently available commercial off the shelf (COTS) 10BASE-T Ethernet interface circuits are not acceptable for space flight because the COTS 10BASE-T Ethernet interface circuits are susceptible to radiation induced upsets and/or failure and are limited in reliability. The current COTS 10BASE-T Ethernet interface circuits rely on non-radiation hardened chipsets that provide IEEE 802.3 standard for Ethernet physical layer interfaces separate from field programmable gate arrays (FPGAs) and/or processors, including FPGAs and/or processors hosting media access controllers (MACs) and/or user applications. Thus, the current COTS 10BASE-T Ethernet interface circuits do not provide physical layer interfaces for IEEE 802.3 standard for Ethernet on radiation hardened FPGAs.

The various embodiments may provide a radiation hardened 10BASE-T Ethernet interface circuit suitable for space flight and in compliance with the IEEE 802.3 standard for Ethernet. In various embodiments, a custom circuit may be used in conjunction with a front-end FPGA to implement an Ethernet physical layer (PHY) in compliance with the IEEE 802.3 standard for Ethernet. In the various embodiments, the custom circuit may make use of radiation hardened parts. In the various embodiments, the custom circuit may handle the electrical interface between standard differential Ethernet signals and the digital signal levels in the FPGA. The portion of the Ethernet PHY that may be located in the FPGA, such as a physical layer interface module, may handle meeting the protocol requirements of the IEEE 802.3 standard for Ethernet. The portion of the Ethernet PHY that may be located in the FPGA, such as a physical layer interface module, may be responsible for decoding received signals, such as packets, link pulses, etc., and encoding transmitted signals, such as data packets, link pulses, etc. Decoded payload data may be sent to a user interface or application (internal to the FPGA or running on a connected processor) and the user interface or application may send data for transmission back to the portion of the Ethernet PHY that may be located in the FPGA.

The various embodiments may provide a 10BASE-T Ethernet interface circuit, comprising a FPGA, a transmitter circuit connected to the FPGA, a receiver circuit connected to the FPGA, and a transformer connected to the transmitter circuit and the receiver circuit. In the various embodiments, the FPGA, transmitter circuit, receiver circuit, and transformer may be radiation hardened. In various embodiments, the FPGA may include a physical layer interface module configured to exchange data with a MAC. In various embodiments, the transmitter circuit may be configured to receive a transmission signal from the physical layer interface module, and the transmitter circuit may comprise an amplification stage configured to amplify the transmission signal, and a filter stage connected to the amplification stage and configured to filter the amplified transmission signal. In the various embodiments, the transmission signal from the physical layer interface module may be a link pulse, idle pulse, user data, any other type Ethernet data, or any other type mode supported by the IEEE 802.3 standard for Ethernet. In various embodiments, the receiver circuit may be configured to send a difference indication signal to the physical layer interface module, and the receiver circuit may comprise a resistor network configured to reduce an amplitude of a received signal, and a low voltage differential signal receiver connected to the resistor network and configured to output the difference indication signal to the physical layer interface module in response to receiving the reduced amplitude received signal from the resistor network. In the various embodiments, the received signal and the resulting difference indication signal from the physical layer interface module may be a link pulse, idle pulse, user data, any other type Ethernet data, or any other type mode supported by the IEEE 802.3 standard for Ethernet. In the various embodiments, the transformer may be configured to receive the filtered amplified transmission signal from the filter stage and output the filtered amplified transmission signal to a connector, and receive the received signal from the connector and output the received signal to the resistor network. The various embodiments may provide a provide a 10BASE-T Ethernet interface circuit suitable for space flight that may provide a 10BASE-T link pulse transmit mask and data mask according to the IEEE 802.3 standard for Ethernet, using operational amplifiers with very high slew rate and high bandwidth and which may be radiation hardening to 100 kRads.

Figure 1:
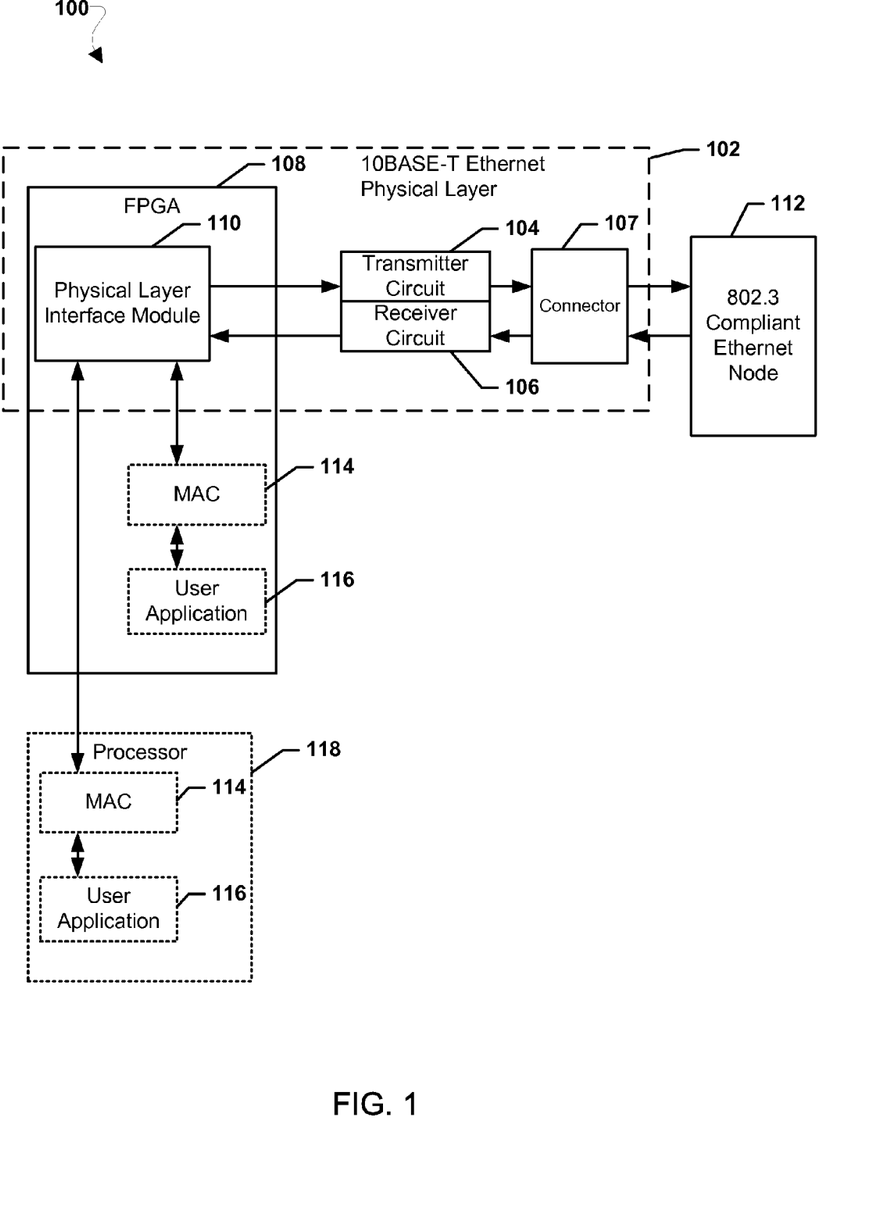
FIG. 1 is block diagram of an Ethernet communication system according to an embodiment including a 10BASE-T Ethernet Physical Layer.

FIG. 1 is block diagram of an Ethernet communication system 100 according to an embodiment including a 10BASE-T Ethernet Physical Layer provided by a 10BASE-T Ethernet interface circuit 102. The 10BASE-T Ethernet interface circuit 102 may include a FPGA 108 including a physical layer interface module 110, a transmitter circuit 104 connected to the FPGA 108, such as by one or more wire and/or circuit board line to one or more pin of the FPGA 108, a receiver circuit 106 connected to the FPGA 108, such as by one or more wire and/or circuit board line to one or more pin of the FPGA 108, and a connector 107 connected to the transmitter circuit 104 and receiver circuit 106, such as by one or more wire and/or circuit board line. The FPGA 108, the transmitter circuit 104, the receiver circuit 106, and the connector 107 may be radiation hardened parts, such as parts radiation hardened to withstand 100 kRads of radiation. In one embodiment, the connector 107 may not be a RJ-45 connector. In other embodiments, the connector 107 may be any type connector, including a RJ-45 connector. The connector 107 may enable the 10BASE-T Ethernet interface circuit 102 to connect to a IEEE 802.3 standard for Ethernet compliant node 112 in the system 100 via one or more wires and send and receive signals with the node 112 according to the IEEE 802.3 standard for Ethernet.

The physical layer interface module 110 of the FPGA 108 may exchange data with a MAC 114 which may exchange data with a user application 116. In some embodiments the MAC 114 and/or user application 116 may be running on the FPGA 108. In other embodiments, the MAC 114 and/or user application 116 may be running on a separate processor 118 connected to the FPGA 108, such as by one or more wire and/or circuit board line to one or more pin of the FPGA 108. The user application 116 may send and/or receive data for transmission to the node 112 via the MAC 114 and the 10BASE-T Ethernet interface circuit 102. The physical layer interface module 110 of the FPGA 108 may include both a media-independent interface (MII) and management data input/output interface (MDIO) connection to the MAC 114 and the physical layer interface module 110 may be configured to implement physical layer signaling and transmit and receive functions according to the IEEE 802.3 standard for Ethernet. While illustrated as a single FPGA 108 in FIG. 1, FPGA 108 may include two or more FPGAs connected together and functions of the physical layer inference module 110 may be distributed across the more than one FPGA. As examples, the FPGA 108 may be a Xilinx® XC4VFX60-FF152 FPGA, an Aeroflex® FPGA, RTAX2000-CQ352 FPGA, combinations of one or more Xilinx® XC4VFX60-FF152 FPGAs, one or more Aeroflex® FPGAs, and/or one or more RTAX2000-CQ352 FPGA, or any other type FPGAs. In the various embodiments, internal block memory (e.g., BRAM) cells of the FPGA 108, such as internal BRAM cells of an RTAX2000-CQ352 FPGA, may not be used to store programming and/or handle data associated with the physical layer inference module 110 as the cells may be susceptible to radiation induced upsets.

In operation, data from the MAC 114 for transmission to the node 112 may be converted by the physical layer interface module 110 of the FPGA 108 to a transmission signal output to the transmitter circuit 104. The transmission signal may include a positive and negative component. The positive and negative components of the transmission signal may be digital signals and the transmitter circuit 104 may convert the digital signals to analog waveforms with voltage levels and shapes conforming to the IEEE 802.3 standard for Ethernet through various operations on the transmission signal, including amplification and filtering. The amplified and filtered transmission signal including positive and negative components with analog waveforms with voltage levels and shapes conforming to the IEEE 802.3 standard for Ethernet may be output to the connector 107 and sent to the node 112 as an Ethernet transmit (Tx) differential signal (e.g., Tx+ and Tx−). The node 112 may also output a signal to the connector 107, such as an Ethernet receive (Rx) differential signal (e.g., Rx+ and Rx−). The received signal from the node 112 may be an analog signal with a positive and negative component with analog waveforms with voltage levels and shapes conforming to the IEEE 902.3 standard for Ethernet. The receiver circuit 106 may receive the received signal from the connector 107 and generate a difference indication signal and send the difference indication signal to the physical layer interface module 110 of the FPGA 108. The physical layer interface module 110 of the FPGA 108 may convert the difference indication signal to data and provide the data to the MAC 114. For example, based on the difference indication signal the physical layer interface module 110 of the FPGA 108 may determine whether the received signal that resulted in the generation of the difference indication signal may be a link pulse, idle pulse, user data, any other type Ethernet data, or any other type mode supported by the IEEE 802.3 standard for Ethernet, and in response to determining the type mode of the received signal and resulting difference indication signal physical layer interface module 110 of the FPGA 108 may convert the difference indication signal to data and provide the data to the MAC 114.

Figure 2:
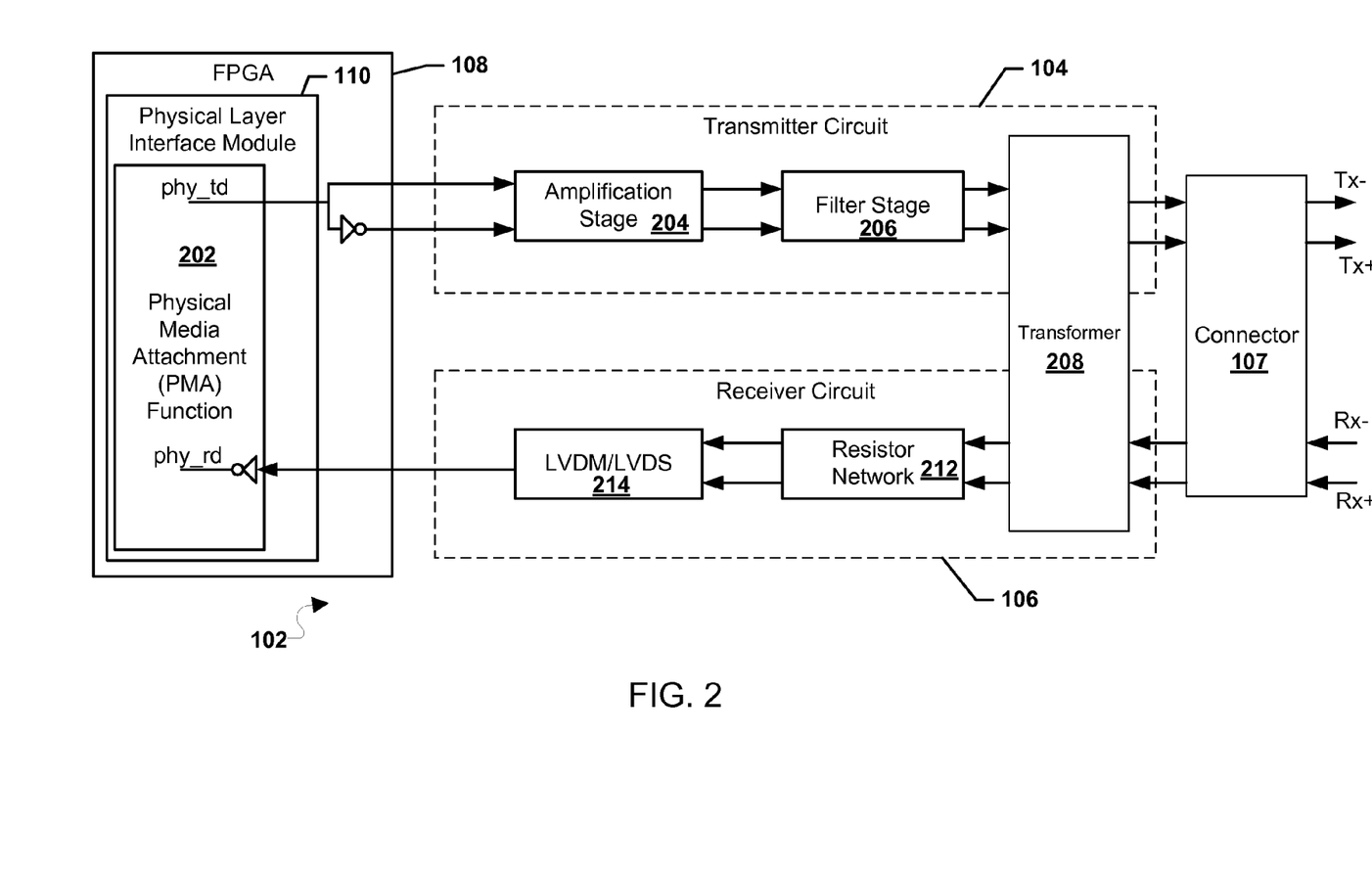
FIG. 2 is a block diagram of a 10BASE-T Ethernet Physical Layer including a transmitter circuit and a receiver circuit according to an embodiment.

FIG. 2 is a block diagram of the 10BASE-T Ethernet interface circuit 102 showing circuit elements of the transmitter circuit 104 and receiver circuit 106 and the connections to the physical layer interface module 110. A transmission output (phy_td) from the physical media attachment (PMA) function 202 of the physical layer interface module 110 may be split into two separate components, and one of the two components may be inverted such that the inverted component may be the negative component of the transmission signal and the un-inverted component may be the positive component of the transmission signal. The transmission signal from the transmission output (phy_td) may be sent to an amplification stage 204 of the transmitter circuit 104. The amplification stage 204 may be configured to amplify the transmission signal. For example, the amplification stage 204 may have a gain of −1.52 or any other gain, and the gain may be selected based on the voltage of the FPGA 108. For example, when the FPGA 108 has a voltage level of 3.3 volts, the gain of the amplification stage 204 may be −1.52 and gain may be different when the voltage level of the FPGA 108 is different to compensate for the voltage level of the FPGA 108. FIGS. 3A-3D discussed below illustrate example configurations of the amplification stage 204. As general examples, the amplification stage 204 may include two AD844 op amps from Analog Devices and the op amps may be tuned to amplify and filter the differential data sent from the FPGA to meet the signal levels and speeds required by the IEEE 802.3 standard for Ethernet (e.g., 10 Mbps).

Figure 4:
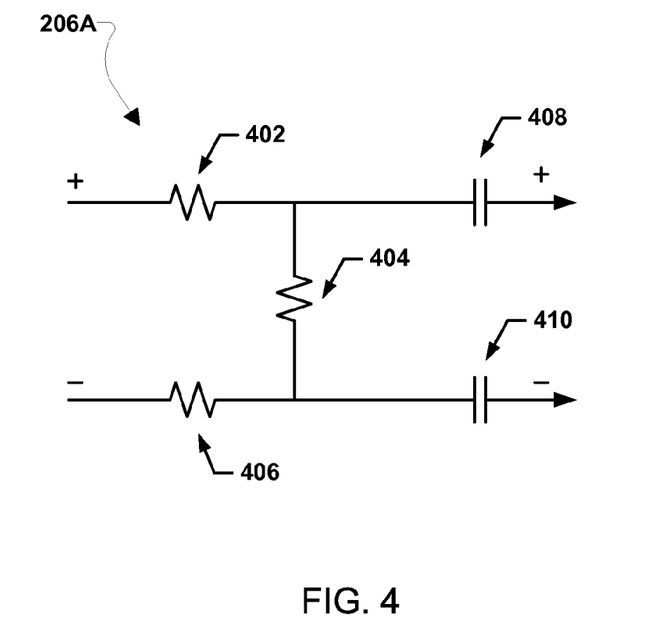
FIG. 4 is a block diagram of an embodiment filter stage suitable for use in the transmitter circuit of the 10BASE-T Ethernet Physical Layer illustrated in FIG. 2.
Figure 6A:
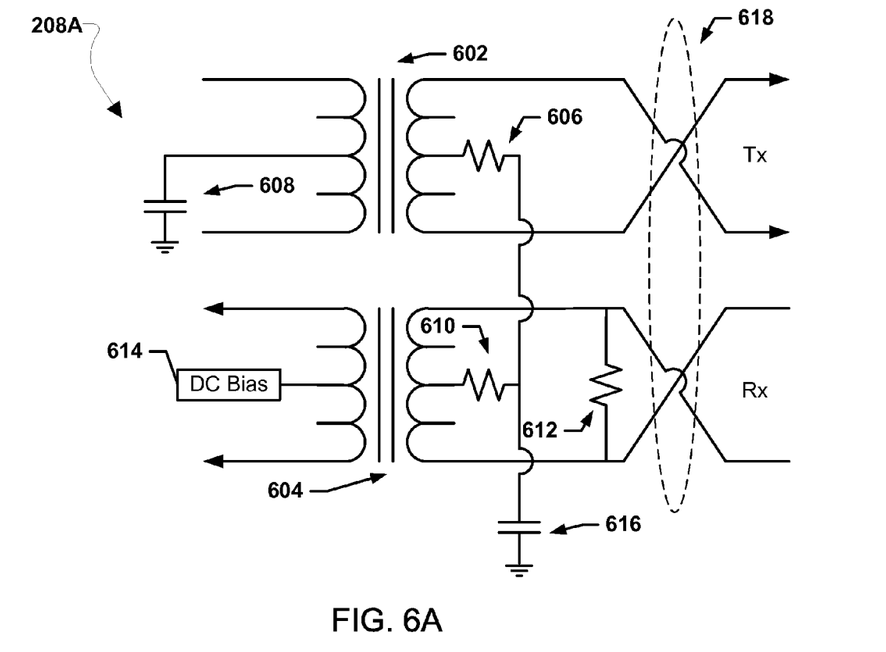
FIGS. 6A and 6B are block diagrams of various embodiment transformers suitable for use in the 10BASE-T Ethernet Physical Layer illustrated in FIG. 2.
Figure 6B:
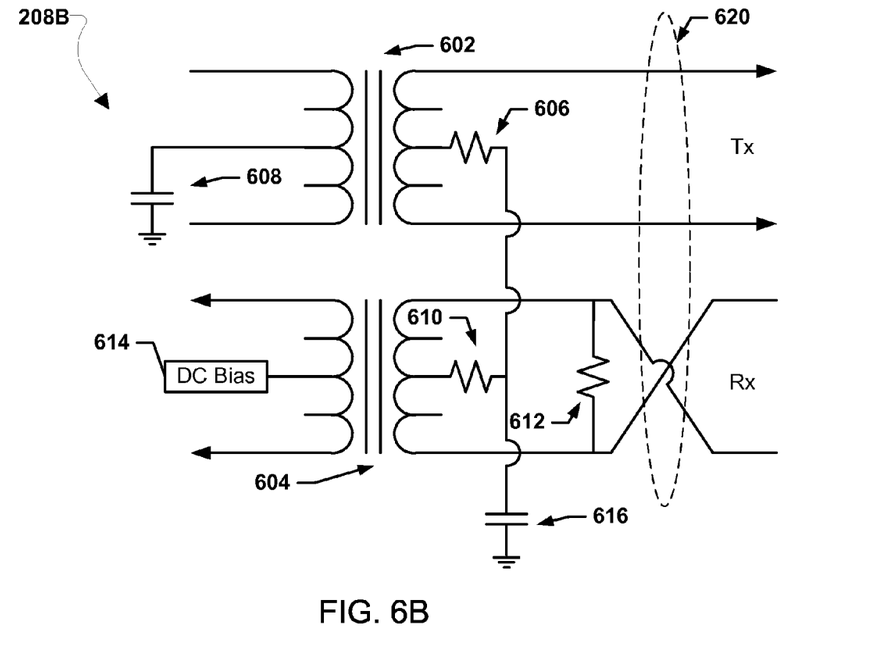

The amplification stage 204 may be connected to the filter stage 206 of the transmitter circuit 104 and the amplification stage 204 may output positive and negative components of the amplified transmission signal to the filter stage 206 which may filter the transmission signal amplified by the amplification stage 204. For example, the filter stage 206 may be a high pass filter. A high pass filter will return the differential pair signals (TX+, TX−) to a differential voltage of 0V when not transmitting signals, such as data or link pulses. FIG. 4 discussed below illustrates an example configuration of the filter stage 206. The filter stage 206 may output positive and negative components of the filtered amplified transmission signal to the transformer 208. The transformer 208 may be single transformer dedicated to the transmitter circuit 104 or may be a shared transformer 208 with separate transformer portions shared by the transmitter circuit 104 and receiver circuit 106. The transformer 208 may be a 1 to 1 (1:1) transformer that may provide electrical isolation to the 10BASE-T Ethernet interface circuit 102. The transformer 208 may output the received positive and negative components of the filtered amplified transmission signal to the connector 107. FIGS. 6A and 6B discussed below illustrate example configurations of the transformer 208.

Figure 5:
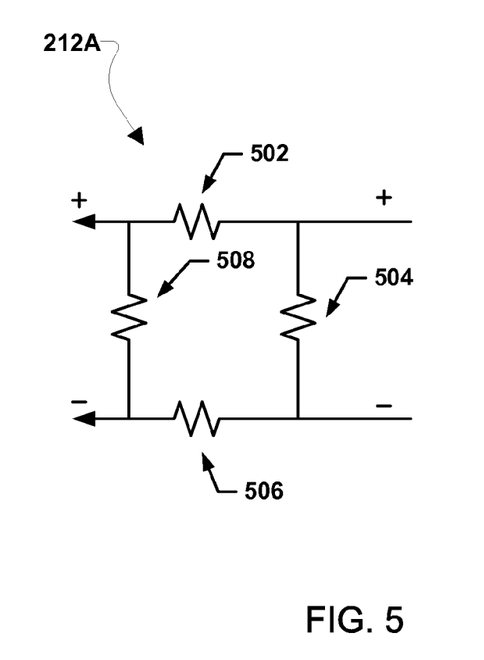
FIG. 5 is a block diagram of an embodiment resistor network suitable for use in the receiver circuit of the 10BASE-T Ethernet Physical Layer illustrated in FIG. 2.

The connector 107 may output the positive and negative components of the received differential signal (e.g., Rx+ and Rx−) to the transformer 208 and the transformer 208 may output the received signal to a resistor network 212 of the receiver circuit 106. The resistor network 212 may reduce the amplitude of the received signal. For example, the resistor network 212 may reduce the voltage of the received signal to a value in the range of 300 mV to 1V. FIG. 5 discussed below illustrates an example configuration of a resistor network 212. The resistor network 212 may be connected to a low voltage differential signal receiver, such as a low voltage differential multi-drop (LVDM)/low voltage differential signal (LVDS) device 214, and the resistor network 212 may output the positive and negative components of the reduced amplitude received signal to the LVDM/LVDS 214. The LVDM/LVDS 214 may compare the positive and negative components of the reduced amplitude received signal and may drive a high signal (e.g., a "1"), when the differential is above a threshold, such as greater than −200 mV, which may cover a range when the absolute value of the differential voltage is less than 200 mV. The output of the LVDM/LVDS 214 may be a difference indication output to the reception input (phy_rd) at the PMA function 202 of the physical layer interface module 110 (e.g., a difference indication signal). In an embodiment, the receive pairs may be crossed at the transformer 208 such that a negative difference indication signal may be generated and passed to the FPGA 108 and the FPGA may invert the negative difference indication signal such that the difference indication is positive when received at the reception input (phy_rd) at the PMA function 202. This inversion of the difference indication signal may be required when the LVDM/LVDS 214 defaults to driving a logic '1' to the physical layer interface module 110 when the received differential signal is 0V.

Figure 3A:
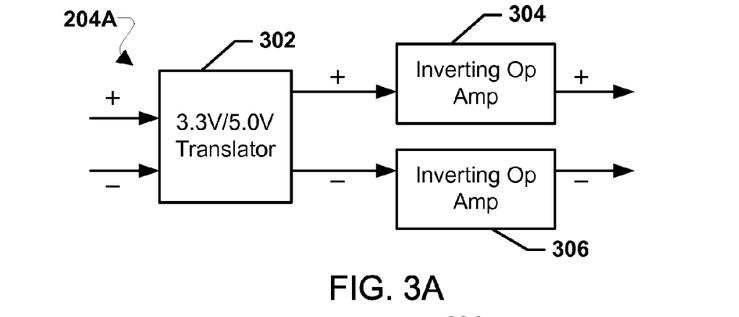
FIGS. 3A, 3B, 3C, and 3D are block diagrams of various embodiment amplifier stages suitable for use in the transmitter circuit of the 10BASE-T Ethernet Physical Layer illustrated in FIG. 2.
Figure 3B:
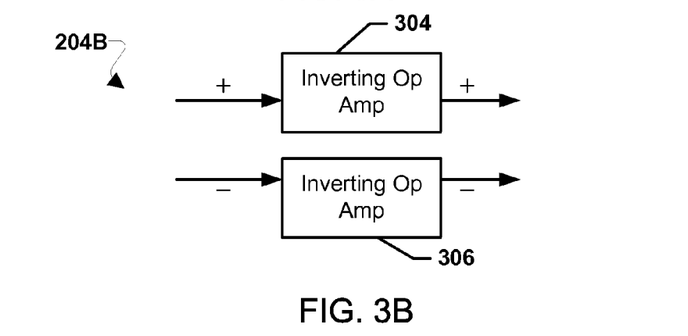
Figure 3C:
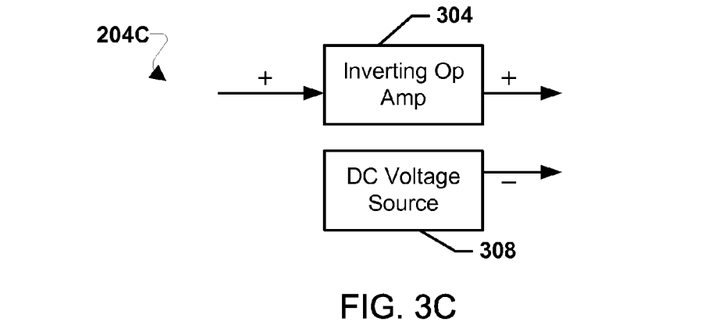
Figure 3D:
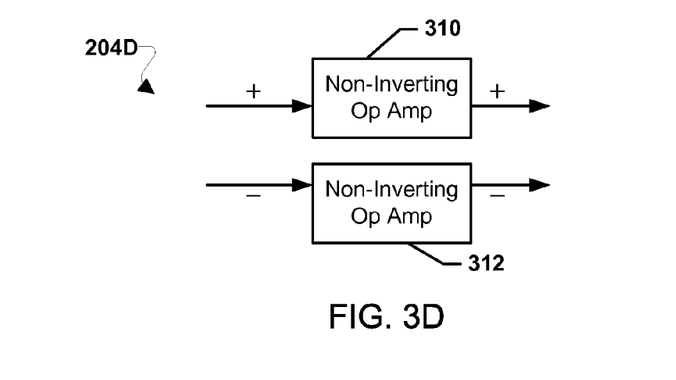

FIGS. 3A, 3B, 3C, and 3D are block diagrams of various embodiment amplifier stages 204A-204D suitable for use in the transmitter circuit 104 of the 10BASE-T Ethernet interface circuit 102 illustrated in FIG. 2. FIG. 3A illustrates a first configuration of an amplification stage 204A including a voltage translator 302 connected to a first inverting op amp 304 and a second inverting op amp 306. The voltage translator 302 may translate the voltage level of the transmission signal from 3.3 volts to 5.0 volts, or any other voltage as needed based on the FPGA 108 voltage and the positive and negative components of the transmission signal may be passed to the first inverting op amp 304 and second inverting op amp 306, respectively. As an example, first inverting op amp 304 and second inverting op amp 306 may have −1.0 voltage gains. The positive component of the transmission signal may be translated by the voltage translator 302 and amplified by the first inverting op amp 304 and the negative component of the transmission signal may be translated by the voltage translator 302 and amplified by the second inverting op am 306. The inverting op amps 304 and 306 may be high speed current feedback operational amplifiers with high slew rates, such as up to 2000 V/μsec and bandwidths of 60 MHz at a gain of −1, such as AD844 monolithic op amps. The amplification stage 204A may be configured as a push-pull amplifier using the two op amps 304 and 306 and may result in a very low distortion transformer driver with a gain of −1, which may basically become a different input and differential output amplifier. FIG. 3B illustrates a second configuration of an amplification stage 204B including just two inverting op amps 304 and 306 without voltage translator 302. As an example, first inverting op amp 304 and second inverting op amp 306 may have −1.52 voltage gains in amplification stage 204B. The positive component of the transmission signal may be amplified by the first inverting op amp 304 and the negative component of the transmission signal may be amplified by the second inverting op am 306. FIG. 3C illustrates a third configuration of an amplification stage 204C in which the second inverting op amp 306 may be replaced with a direct current (DC) voltage source 308. The DC voltage source 308 may output a negative DC voltage while the positive component of the transmission signal may be amplified by the first inverting op amp 304. In an alternate embodiment, the first inverting op amp 304 may be replaced with a non-inverting op amp in amplification stage 204C. FIG. 3D illustrates a fourth configuration of an amplification stage 204D including two non-inverting op amps 310 and 312. As an example, first non-inverting op amp 310 and second non-inverting op amp 312 may have +1.52 voltage gains in amplification stage 204D. The positive component of the transmission signal may be amplified by the first non-inverting op amp 310 and the negative component of the transmission signal may be amplified by the second non-inverting op am 312. In the amplification stage configurations, when non-inverting op amps are selected, the signals for the positive and negative Ethernet transmissions may not need to be crossed across the transformer stage.

FIG. 4 is a block diagram of an example filter stage 206A suitable for use in the transmitter circuit 104 of the 10BASE-T Ethernet interface circuit 102 illustrated in FIG. 2. The filter stage 206A may include a resistor 402 and capacitor 408 connected in series on the positive transmission signal line of the filter stage 206A and resistor 406 and capacitor 408 connected in series on the negative transmission signal line of the filter stage 206A. A resistor 404 may be connected across the positive and negative transmission signal lines of the filter stage 206A. The resistors 402 and 406 may be 56 ohm resistors and the resistor 404 may be a 1000 ohm resistor. The capacitors 408 and 410 may be 4700 pF capacitors.

FIG. 5 is a block diagram of an example resistor network 212A suitable for use in the receiver circuit 106 of the 10BASE-T Ethernet interface circuit 102 illustrated in FIG. 2. The resistor network 212A may comprise resistors 502 and 506 on the positive and negative received signal lines and resistors 504 and 508 connected across the positive and negative received signal lines. The resistor 504 may terminate the twisted pair wires of the Ethernet connection while the resistors 502, 506 and 508 may act as a voltage divider to scale down the incoming received signal to a level that may be appropriate for the LVDM/LVDS 214. The resistor 508 may be a 100 ohm resistor, the resistors 502 and 506 may be 499 ohm resistors, and the resistor 508 may be a 1000 ohm resistor.

FIGS. 6A and 6B are block diagrams of example transformer configurations suitable for use in the 10BASE-T Ethernet interface circuit 102 illustrated in FIG. 2. FIG. 6A illustrates transformer 208A including a transformer section 602 that may be associated with the transmitter circuit 104 and a transformer section 604 that may be associated with the receiver circuit 106. The center tap of the FPGA 108 side of the transformer section 602 may be connected to a capacitor 608 and the center tap of the transformer section 602 on the connector 107 side may be connected to a resistor 606. The resistor 606 may be a 75 ohm resistor. The center tap of the FPGA 108 side of the transformer section 604 may be connected to a DC bias voltage 614 and the center tap of the transformer section 604 on the connector 107 side may be connected to a resistor 610. The DC bias voltage 614 may operate to center the incoming signal to a value around the differential midpoint of the LVDM/LVDS 214. The resistor 610 may be a 75 ohm resistor. The center tap resistors 606, 610 may be connected in series to a capacitor 616 connected to ground. While illustrated as connected transformer sections 602, 604 comprising one overall transformer 208A, the transformer sections 602, 604 may be independent of one another and operate as separate transformers. In such a configuration, the resistors 606, 610 may each be connected to their own respective capacitor. A resistor 612, such as a 1000 ohm resistor, may be connected across the positive and negative lines of the transformer section 604 connected to the connector 107. As illustrated in FIG. 6A the positive and negative lines of the transformer sections 602, 604 may be swapped across the transformer 208A before being connected to the connector 107. For example, the positive and negative lines of the transformer sections 602, 604 may be swapped across the transformer 208A by cross connecting of the positive and negative lines of the transformer sections 602, 604 through one or more board holes 618 connecting the positive lines of transformer sections 602, 604 to negative transmit and receive pins of the connector 107 and connecting the negative lines of the transformer sections 602, 604 through one or more board holes 618 connecting the negative lines of transformer sections 602, 604 to positive transmit and receive pins of the connector 107. The swap across the transformer 208A may be necessary when inverting op amps are used in the amplification stage 204 of the transmitter circuit and/or may ensure that a negative difference indication signal is passed from the LVDM/LVDS 214 to the FPGA 108.

FIG. 6B illustrates a transformer 208B similar to the transformer 208A illustrated in FIG. 6A, except that the positive and negative lines of the transformer sections 602, 604 may not be swapped across the transformer 208B before being connected to the connector 107. Additionally, in an alternative embodiment, one of either the positive and negative lines of the transformer section 602 or 604 may not be swapped across the transformer 208B while the other transformer section 602 or 604 may be swapped across the transformer 208B. For example, the transmitter circuit 104 may include non-inverting op amps and the positive and negative lines of the transformer section 602 may not be swapped across the transformer 208B while the receiver circuit 106 associated transformer section 604 may be swapped across the transformer 208B.

Figure 7:
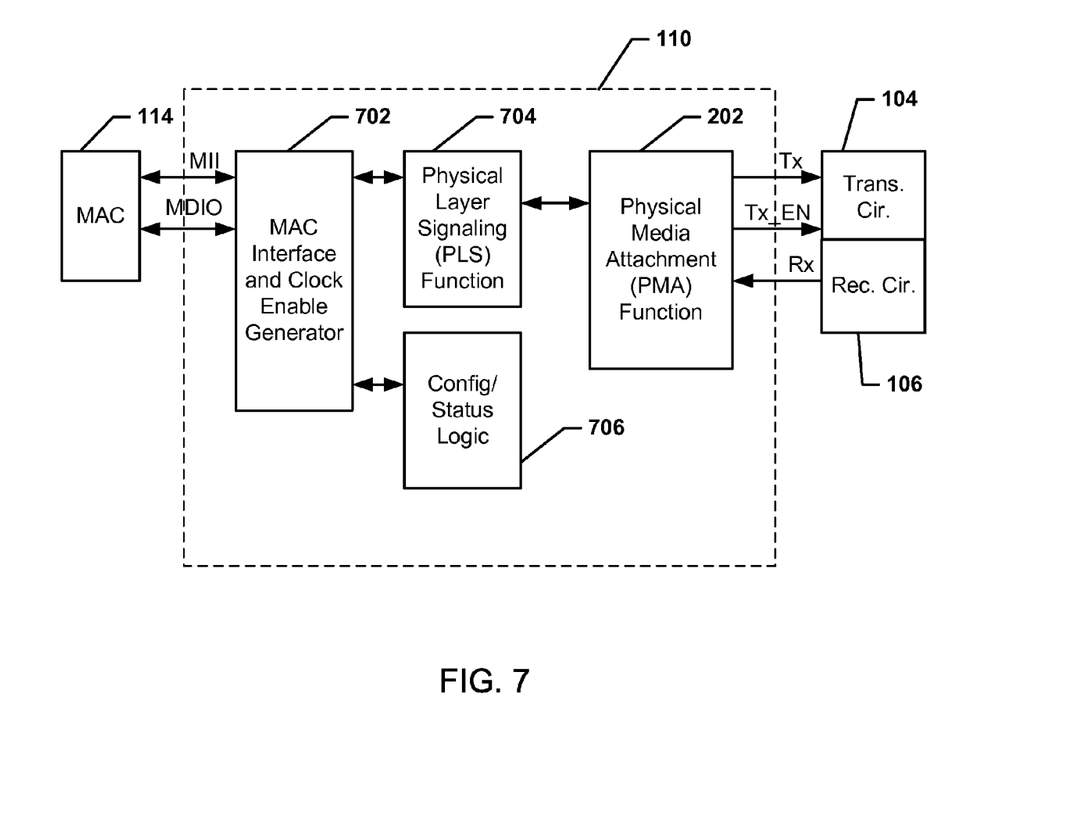
FIG. 7 is block diagram of logical elements of a physical layer interface module of a 10BASE-T Ethernet Physical Layer according to an embodiment.

FIG. 7 is block diagram of logical elements of a physical layer interface module 110 of a 10BASE-T Ethernet Physical Layer according to an embodiment. The physical layer interface module 110 may be a container resident on the FPGA that includes a MAC interface and clock enable generator function 702, physical layer signaling (PLS) function 704, configuration/status logic function 706, and the PMA function 202. As an example, the physical layer interface module 110 and the functions 702, 704, 706, and 202 may be written in Very High Speed Integrated Circuit (VHSIC) Hardware Description Language (VHDL). The MAC interface and clock enable generator function 702 (labeled "scphy" in FIGS. 9 and 11) may implement a IEEE 802.3 standard for Ethernet compliant 10BASE-T physical layer transceiver in programmable logic fabric. The MAC interface and clock enable generator function 702 may be a FPGA fabric-only PHY transceiver created in programmable logic which may be used in a radiation-tolerant FPGA. The MII interface connection from/to the MAC 114 may carry user data as specified by the IEEE 802.3 standard for Ethernet for connecting a MAC to a PHY. The MDIO interface connection from/to the MAC 114 may be a PHY control interface specified by IEEE 802.3 standard for Ethernet. These two interfaces may enable the MAC interface and clock enable generator function 702 to be paired with any MAC core or chip. The MAC interface and clock enable generator function 702 may handle data provisioning to and from the MAC 114, and may provide clock enable management. The physical layer interface module 110 may run from an oversampled clock to allow it to handle analog signaling as controlled by the MAC interface and clock enable generator function 702.

The configuration/status logic function 706 may include the configuration and status registers for the physical layer interface module 110. The PLS function 704 implements physical layer signaling (PLS) according to the IEEE 802.3 standard for Ethernet. The PLS function 704 may be an interface layer between the byte-oriented MII interface and the bit-oriented PMA function 202. The PLS function 704 may provide signal encoding/decoding (Manchester), nybble-to-bit conversion, receiver clock recovery, and Ethernet preamble detection. The PMA function 202 (labeled scphy_pma in FIGS. 9 and 11) may implement the correct electrical waveform formation to transmit and receive the 10BASE-T signals from the analog interface (i.e., the transmitter circuit 104 and receiver circuit 106). PMA function 202 may implement the Transmit, Receive, Loopback, Jabber Detection, Link Integrity Test, and Collision Presence functions specified in the IEEE 802.3 standard for Ethernet. The PMA function 202 interfaces directly to the analog interface electronics (i.e., the transmitter circuit 104 and receiver circuit 106), which are external to the host FPGA. By placing the physical layer interface module 110 in a radiation-hardened FPGA and pairing it with the external analog design (including the digital buffers and transformer) the physical layer interface module 110 may provide a radiation-hardened 10BASE-T physical interface. While discussed in terms of a radiation hardened FPGA, the design of the physical layer interface module 110 may be portable into other FPGAs and into other architectures, such as application specific integrated circuits (ASICs).

Figure 8:
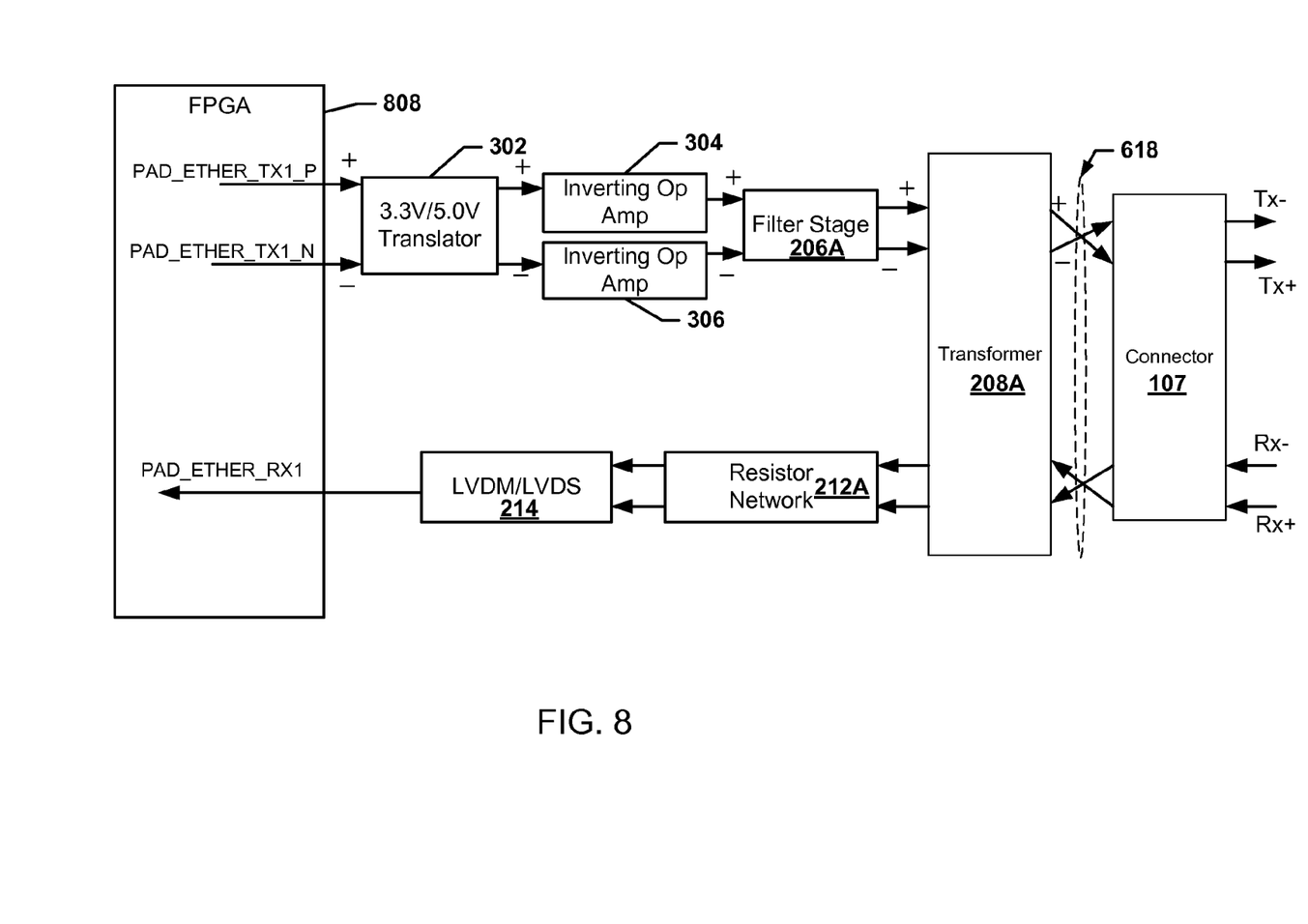
FIG. 8 is an example 10BASE-T Ethernet Physical Layer according to an embodiment.
Figure 9:
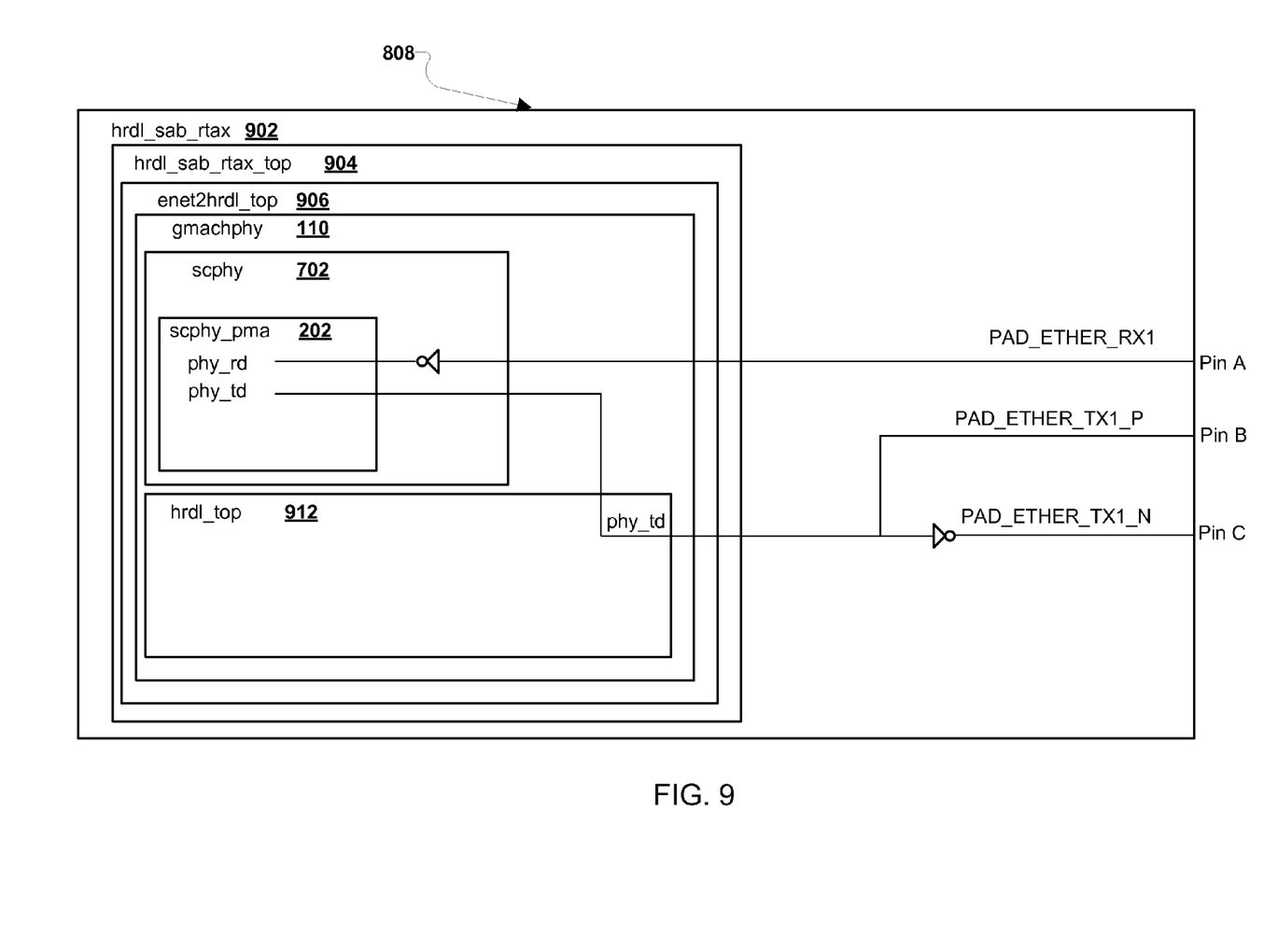
FIG. 9 is a block diagram of modules of a field programmable gate array (FPGA) of the 10BASE-T Ethernet Physical Layer illustrated in FIG. 8.

FIG. 8 is an example 10BASE-T Ethernet Physical Layer according to an embodiment and FIG. 9 is a block diagram of modules of the FPGA 808 of the 10BASE-T Ethernet Physical Layer illustrated in FIG. 8. The 10BASE-T Ethernet Physical Layer illustrated in FIG. 8 was tested at the University of New Hampshire and verified to adhere to the IEEE 802.3 standard for Ethernet. The 10BASE-T Ethernet Physical Layer illustrated in FIG. 8 is designed to work on the Express Logistics Carrier (ELC) system built by NASA Goddard Space Flight Center for installation on the International Space Station (ISS). The 10BASE-T Ethernet Physical Layer illustrated in FIG. 8 may include a FPGA 808 similar to the FPGA 108 described above, as well as a transmitter circuit including voltage translator 302, inverting op amps 304, 306, filter stage 206A, and transformer 208A and a receiver circuit including transformer 208A, resistor network 212A, and LVDM/LVDS 214 as described above. The inverting op amps 304, 306 may be high speed current feedback operational amplifiers with high slew rates, such as up to 2000 V/sec and bandwidths of 60 MHz at a gain of −1, such as AD844 monolithic op amps. The amplification stage may be configured as a push-pull amplifier using the two op amps 304, 306 and may result in a very low distortion transformer driver with a gain of −1, which may basically become a different input and differential output amplifier. The transmitter circuit may also incorporate a RLC high pass filter as the filter stage 206A with Ethernet 10BASE-T dual transformer 208A, and may operate as a DC block with a cutoff frequency of approximately 10 kHz with the differential signals for Tx− and Tx+ routed as 50 ohm pairs. As illustrated in FIG. 9, the FPGA 808 may include various modules including hrdl_sab_rtax 902, hrdl_sab_rtax_top 904, enet2hrdl_top 906, physical layer interface module 110, MAC interface and clock enable generator function 702, PMA function 202, and hrdl_top 912. The difference indication signal PAD_ETHER_RX1 may be inverted by the MAC interface and clock enable generator function 702. The transmission signal PAD_ETHER_TX1_P may be split and one portion inverted by the hardl_sab_rtax module 902 to generate a negative transmission signal component PAD_ETHER_TX1_N. The signals may be received and/or sent on various pins, A, B, and C of the FPGA 808, such as pins 325, 287, and 288, respectively, of a RTAX2000-CQ352 FPGA.

Figure 10:
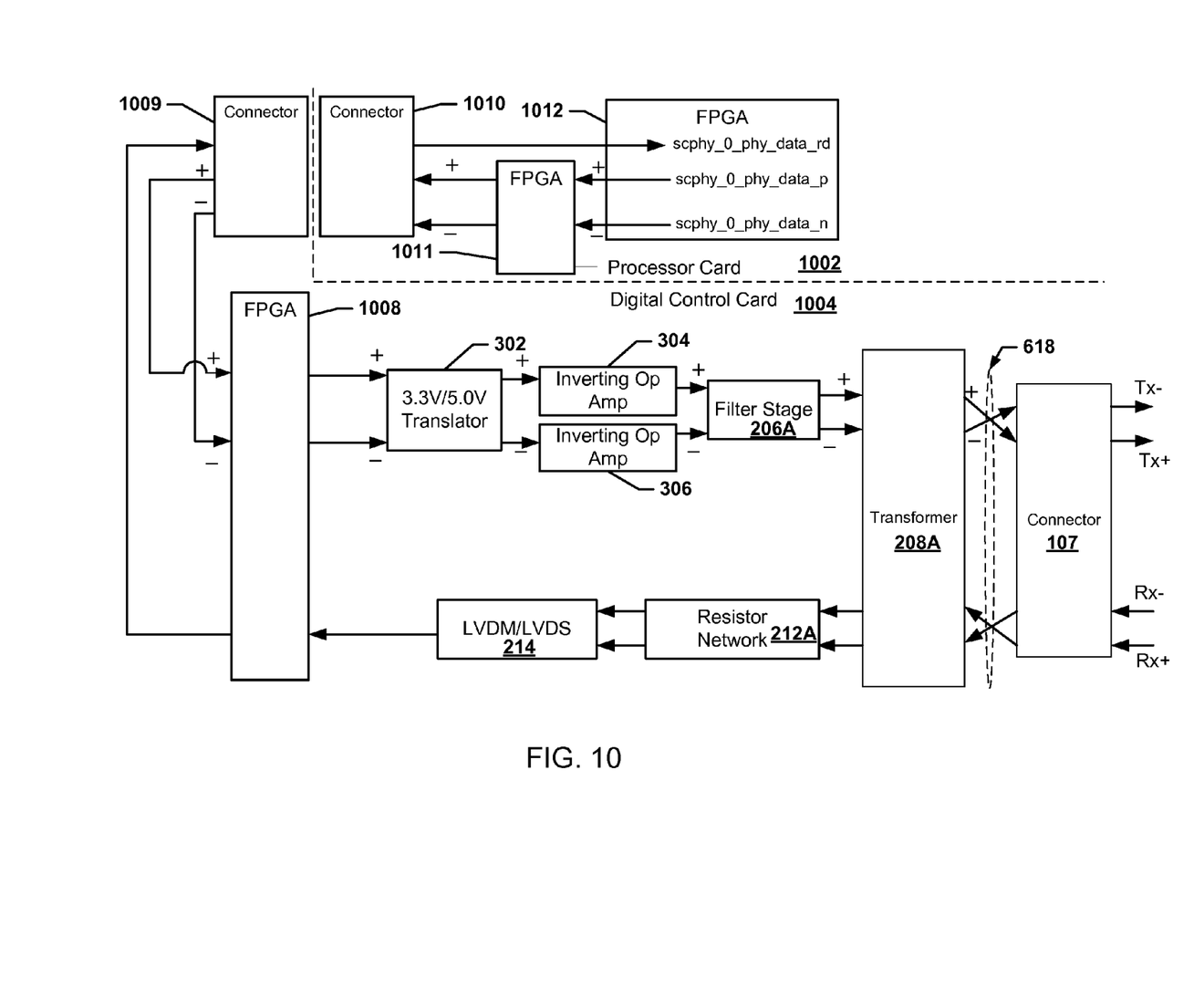
FIG. 10 is another example 10BASE-T Ethernet Physical Layer according to another embodiment.
Figure 11:
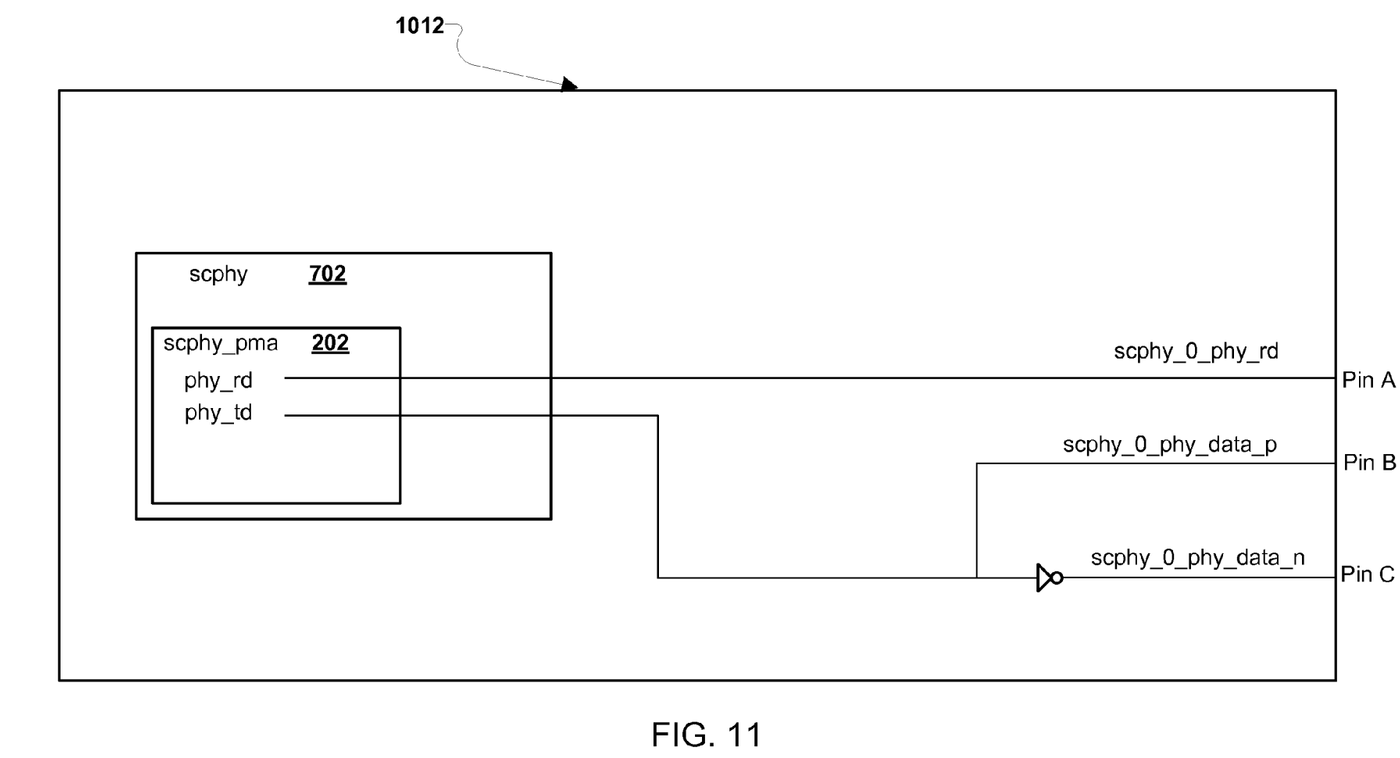
FIG. 11 is a block diagram of modules of a FPGA of the 10BASE-T Ethernet Physical Layer illustrated in FIG. 10.

FIG. 10 is another example 10BASE-T Ethernet Physical Layer according to another embodiment and FIG. 11 is a block diagram of modules of a FPGA 1012 of the 10BASE-T Ethernet Physical Layer illustrated in FIG. 10. The 10BASE-T Ethernet Physical Layer illustrated in FIG. 10 represents an upgrade to the 10BASE-T Ethernet Physical Layer illustrated in FIG. 8 with an enhanced transmission portion configured to support data transmission, such as payload data transmission, and not merely link pulse transmission. The 10BASE-T Ethernet Physical Layer illustrated in FIG. 10 is designed to work with the SpaceCube and has operated on the ISS communicating with the ELC. Rather than a single FPGA as illustrated in FIG. 8, the 10BASE-T Ethernet Physical Layer illustrated in FIG. 10 may include multiple FPGAs 1012, 1011, 1008 in communication with one another. For example, the FPGA 1012 may be a XC4VFX60-FF1152 FPGA in communication with Aeroflex FPGAs 1011, 1008. The FPGA 1008 may be connected to the transmitter circuitry and receiver circuitry on a digital control card 1004 that may connect to a processor card 1002 including the FPGA 1011 and FPGA 1012. Connectors 1009, 1010 on the digital control card 1004 and processor card 1002, respectively, may connect the FPGAs 1012, 1011, and 1008 together. The connectors 1009, 1010 may be stacking connectors. As illustrated in FIG. 11, the FPGA 1012 on the processor card 1002 may include the MAC interface and clock enable generator function 702, PMA function 202. The difference indication signal scphy_0_phy_rd may be inverted by the FPGA 1008 and provided to the FPGA 1012 via connectors 1009 and 1010. The transmission signal schpy_0_phy_data_p may be split and one portion inverted by the FPGA 1012 to generate a negative transmission signal component schpy_0_phy_data_p. The positive and negative transmission signal portions may be sent to the FPGA 1011 and on to the FPGA 1008 via connectors 1009 and 1010. The signals may be received and/or sent on various pins, A, B, and C of the FPGA 1012, such as pins R27, M13, and M22, respectively, of a XC4VFX60-FF1152 FPGA.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein. The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

What is claimed is:

1. A 10BASE-T Ethernet interface circuit complying with Institute of Electrical and Electronics Engineers (IEEE) 802.3 standard for Ethernet, the interface circuit comprising:
    a field programmable gate array (FPGA), wherein the FPGA includes a physical layer interface module configured to exchange data with a media access controller (MAC);
    a transmitter circuit connected to the FPGA and configured to receive a transmission signal from the physical layer interface module, wherein the transmitter circuit comprises:
        an amplification stage configured to amplify the transmission signal; and
        a filter stage connected to the amplification stage and configured to filter the amplified transmission signal;
    a receiver circuit connected to the FPGA and configured to send a difference indication signal to the physical layer interface module, wherein the receiver circuit comprises:
        a resistor network configured to reduce an amplitude of a received signal; and
        a low voltage differential signal receiver connected to the resistor network and configured to output the difference indication signal to the physical layer interface module in response to receiving the reduced amplitude received signal from the resistor network; and
    a transformer connected to the transmitter circuit and the receiver circuit, wherein the transformer is configured to:
        receive the filtered amplified transmission signal from the filter stage and output the filtered amplified transmission signal to a connector; and
        receive the received signal from the connector and output the received signal to the resistor network,
    wherein
        the transmission signal comprises a positive and negative component; and
        the amplification stage comprises a voltage translator connected to a first inverting op amp and a second inverting op amp such that the positive component of the transmission signal is translated by the voltage translator and amplified by the first inverting op amp and negative component of the transmission signal is translated by the voltage translator and amplified by the second inverting op amp.

2. The 10BASE-T Ethernet interface circuit of claim 1, wherein the FPGA, the transmitter circuit, the receiver circuit, and the transformer are radiation hardened.

3. The 10BASE-T Ethernet interface circuit of claim 1, wherein the voltage translator is a 3.3V to 5.0V voltage translator and the first and second inverting op amps have −1.0 voltage gain.

4. A 10BASE-T Ethernet interface circuit complying with Institute of Electrical and Electronics Engineers (IEEE) 8023 standard for Ethernet, the interface circuit comprising:
    a field programmable gate array (FPGA), wherein the FPGA includes a physical layer interface module configured to exchange data with a media access controller (MAC);
    a transmitter circuit connected to the FPGA and configured to receive a transmission signal from the physical Layer interface module, wherein the transmitter circuit comprises:
        an amplification stage configured to amplify the transmission signal; and
        a filter stage connected to the amplification stage and configured to filter the amplified transmission signal;
    a receiver circuit connected to the FPGA and configured to send a difference indication signal to the physical Layer interface module, wherein the receiver circuit comprises:
        a resistor network configured to reduce an amplitude of a received signal; and
        a low voltage differential signal receiver connected to the resistor network and configured to output the difference indication signal to the physical layer interface module in response to receiving the reduced amplitude received signal from the resistor network; and a transformer connected to the transmitter circuit and the receiver circuit, wherein the transformer is configured to:

receive the filtered amplified transmission signal from the filter stage and output the filtered amplified transmission signal to a connector; and receive the received signal from the connector and output the received signal to the resistor network, wherein:

the transmission signal comprises a positive component; and the amplification stage comprises a first inverting op amp direct current (DC) voltage source such that the positive component of the transmission signal is amplified by the first inverting op amp and the DC voltage source outputs a negative DC voltage to the filter stage.

5. The 10BASE-T Ethernet interface circuit of claim 4, wherein the first inverting op amp has a −1.52 voltage gain.

6. The 10BASE-T Ethernet interface circuit of claim 2, wherein the filter stage comprises a high pass filter.

7. A 10BASE-T Ethernet interface circuit complying with Institute of Electrical and Electronics Engineers (IEEE) 802.3 standard for Ethernet, the interface circuit comprising:

a field programmable gate array (FPGA), wherein the FPGA includes a physical layer interface module configured to exchange data with a media access controller (MAC);

a transmitter circuit connected to the FPGA and configured to receive a transmission signal from the physical layer interface module, wherein the transmitter circuit comprises:

an amplification stage configured to amplify the transmission signal; and a filter stage connected to the amplification stage and configured to filter the amplified transmission signal;

a receiver circuit connected to the FPGA and configured to send a difference indication signal to the physical layer interface module, wherein the receiver circuit comprises:

a resistor network configured to reduce an amplitude of a received signal; and a low voltage differential signal receiver connected to the resistor network and configured to output the difference indication signal to the physical layer interface module in response to receiving the reduced amplitude received signal from the resistor network; and a transformer connected to the transmitter circuit and the receiver circuit, wherein the transformer is configured to:

receive the filtered amplified transmission signal from the filter stage and output the filtered amplified transmission signal to a connector; and receive the received signal from the connector and output the received signal to the resistor network, wherein the transformer comprises:

a transmitter transformer portion configured to receive the filtered amplified transmission signal from the filter stage and output the filtered amplified transmission signal to a connector; and a receiver transformer portion configured to receive the received signal from the connector and output the received signal to the resistor network.

8. The 10BASE-T Ethernet interface circuit of claim 7, wherein a center tap of the receiver transformer portion is biased to a DC center voltage of the low voltage differential signal receiver.

9. The 10BASE-T Ethernet interface circuit of claim 8, wherein the DC center voltage is 1.6 volts.

10. The 10BASE-T Ethernet interface circuit of claim 2, wherein the physical layer interface module of the FPGA includes both a media-independent interface (MII) and management data input/output interface (MDIO) connection to the MAC and the physical layer interface module of the FPGA is configured to implement physical layer signaling and transmit and receive functions according to the IEEE 802.3 standard for Ethernet.

11. The 10BASE-T Ethernet interface circuit of claim 2, wherein the filtered amplified transmission signal output to the connector and the received signal from the connector are both differential signals according to the IEEE 802.3 standard for Ethernet.

12. A 10BASE-T Ethernet interface circuit complying with institute of Electrical and Electronics Engineers (IEEE) 802.3 standard for Ethernet, the interface circuit comprising:

a field programmable gate array (FPGA), wherein the FPGA, includes a physical layer interface module configured to exchange data with a media access controller (MAC);

a transmitter circuit connected to the FPGA and configured to receive a transmission signal from the physical layer interface module, wherein the transmitter circuit comprises:

an amplification stage configured to amplify the transmission signal; and a filter stage connected to the amplification stage and configured to filter the amplified transmission signal; and a transformer connected to the transmitter circuit, wherein the transmitter is configured to receive the filtered amplified transmission signal from the filter stage and output the filtered amplified transmission signal to a connector, wherein the transmission signal comprises a positive and negative component; and the amplification stage comprises a voltage translator connected to a first inverting op amp and a second inverting op amp such that the positive component of the transmission signal is translated by the voltage translator and amplified by the first inverting op amp and negative component of the transmission signal is translated by the voltage translator and amplified by the second inverting op amp.

13. The 10BASE-T Ethernet interface circuit of claim 12, wherein the FPGA, the transmitter circuit, and the transformer are radiation hardened.

14. A 10BASE-T Ethernet interface circuit complying with Institute of Electrical and Electronics Engineers (IEEE) 802.3 standard for Ethernet, the interface circuit comprising:

a field programmable gate array (FPGA), wherein the FPGA includes a physical layer interface module configured to exchange data with a media access controller (MAC);

a receiver circuit connected to the FPGA and configured to send a difference indication signal to the physical layer interface module, wherein the receiver circuit comprises:

a resistor network configured to reduce an amplitude of a received signal; and a low voltage differential signal receiver connected to the resistor network and configured to output the difference indication signal to the physical layer interface module in response to receiving the reduced amplitude received signal from the resistor network; and a transformer connected to the receiver circuit, wherein the transformer is configured to receive the received signal from the connector and output the received signal to the resistor network, wherein the transformer comprises:

a transmitter transformer portion configured to receive the filtered amplified transmission signal from the filter stage and output the filtered amplified transmission signal to a connector; and a receiver transformer portion configured to receive the received signal from the connector and output the received signal to the resistor network.

15. The 10BASE-T Ethernet interface circuit of claim 14, wherein the FPGA, the receiver circuit, and the transformer are radiation hardened.

\* \* \* \* \*

UNITED STATES PATENT AND TRADEMARK OFFICE
CERTIFICATE OF CORRECTION

PATENT NO. : 9,680,527 B2
APPLICATION NO. : 14/855992
DATED : June 13, 2017
INVENTOR(S) : Michael R. Lin et al.

Page 1 of 1

It is certified that error appears in the above-identified patent and that said Letters Patent is hereby corrected as shown below:

In the Specification

Column 8, Line 25, "508" should be "504".

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*